(12) United States Patent
Bayer et al.

(10) Patent No.: US 11,521,899 B2
(45) Date of Patent: Dec. 6, 2022

(54) METHOD FOR INCREASING THE ELECTRICAL FUNCTIONALITY, AND/OR SERVICE LIFE, OF POWER ELECTRONIC MODULES

(71) Applicant: Fraunhofer-Gesellschaft zur Foerderung der angewandten Forschung e.V., Munich (DE)

(72) Inventors: Christoph Friedrich Bayer, Erlangen (DE); Andreas Schletz, Erlangen (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 53 days.

(21) Appl. No.: 17/216,753

(22) Filed: Mar. 30, 2021

(65) Prior Publication Data
US 2021/0327755 A1 Oct. 21, 2021

(51) Int. Cl.
*H01L 21/768* (2006.01)
*H01L 25/07* (2006.01)

(52) U.S. Cl.
CPC ...... *H01L 21/76894* (2013.01); *H01L 25/072* (2013.01)

(58) Field of Classification Search
CPC ............ H01L 21/76894; H01L 25/072; H01L 2224/32225; H01L 2224/48227; H01L 2224/4846; H01L 2224/48472; H01L 2224/4903; H01L 2224/73265; H01L 21/4857; H01L 21/486; H01L 23/3735
See application file for complete search history.

(56) References Cited

FOREIGN PATENT DOCUMENTS

DE 101 35 348 A1 7/2001
DE 102015013511 B3 10/2015

OTHER PUBLICATIONS

German Examination Report for counterpart German Patent Applicant No. 10 2020 204 116.4 dated Dec. 30, 2020.

*Primary Examiner* — Elias Ullah
(74) *Attorney, Agent, or Firm* — Renner, Kenner, Greive, Bobak, Taylor & Weber

(57) ABSTRACT

In a method for increasing the electrical functionality, and/or service life, of power electronic modules, the power electronic circuit carrier, and/or the metallisation applied onto the power electronic circuit carrier, and/or a base plate connected, or to be connected, to a rear face of the power electronic circuit carrier, is finely structured by means of local material removal with at least one laser beam, so as to reduce thermomechanical stresses occurring during the production or operation of the module. In an alternative form of embodiment, the metallisation applied onto the front face of the power electronic circuit carrier is structured, or an already created structure is refined or supplemented, by means of local material removal with laser radiation, so as to achieve a prescribed electrical functionality of the metallisation.

9 Claims, 2 Drawing Sheets

METHOD FOR INCREASING THE ELECTRICAL FUNCTIONALITY, AND/OR SERVICE LIFE, OF POWER ELECTRONIC MODULES

TECHNICAL FIELD OF APPLICATION

The present invention relates to a method for increasing the electrical functionality, and/or service life, of power electronic modules, which have one, or a plurality of, semiconductor components on a front face of a power electronic circuit carrier (e.g. with a ceramic or organic insulation layer, or a mixture thereof), which supports a metallisation applied onto the front face, or onto the front and rear faces. The invention also relates to power electronic modules designed in accordance with the method.

Power electronic modules, such as those used as converters, inverters, transformers, switched-mode power supplies, or amplifiers, usually have a circuit carrier made of a ceramic substrate, for example, which is provided with a metallic layer, that is to say, metallisation, on both faces. The semiconductor components required for the application in question, such as power transistors, diodes, or power capacitors, are then applied onto a front face of the said circuit carrier and electrically interconnected. The rear face of the circuit carrier can also be connected to a base plate, which can be designed as a heat sink for purposes of cooling the module.

By virtue of the different coefficients of thermal expansion of the materials used in the construction of a power electronic module, in particular of the substrate and the metallisation applied onto the latter, the circuit carriers bend as a result of the high temperatures and different coefficients of thermal expansion of the different materials occurring during the attachment, e.g. by soldering, of the semiconductor components to the circuit carrier, or of the circuit carrier to the base plate. Also during operation of the power electronic module, in particular during an operating mode change (load change), or during a change of the environmental conditions, in particular a temperature change, a temperature-driven deformation of the power module occurs, which represents thermomechanical wear, one of the main limitations on the service life.

In order to reduce deformations and thermomechanical stresses during the production and/or operation of power electronic modules, it is of known art to introduce suitable structures into the circuit carrier by means of material removal. Up to now, these structures have been created using suitable etching methods, usually in edge regions of the circuit carrier, so that the electrical function of the power electronic module is not impaired by the etched structures. The structuring of the front-face metallisation to form the desired conductor tracks for the electrical interconnection of the semiconductor components is also usually carried out with such etching methods.

Starting from this problem, the present invention is based on the object of specifying a method with which the service life, and/or the electrical functionality, of such power electronic modules can be further increased.

PRESENTATION OF THE INVENTION

The object is achieved with the method according to claim 1. Claims 10 and 11 specify power electronic modules that can be obtained with this method. Advantageous forms of embodiment of the method, and of the power electronic modules, are the subject matter of the dependent claims, or can be taken from the following description and from the examples of embodiment.

The method relates to power electronic modules, which have one, or a plurality of, semiconductor components on a front face of a power electronic circuit carrier, for example a ceramic substrate, which supports a metallisation applied onto the front face, or onto the front and rear faces. The front face of the substrate, or circuit carrier, is here understood to be the face on which the semiconductor components are applied. The rear face corresponds to the opposite face. Power electronic modules, or the term power electronics, are here understood to mean systems with electrical circuits that are operated with voltages of 10 V, and/or currents of ≥10 A, and have a correspondingly high thermal loading. In the proposed method, in the course of the production of the said power electronic modules in a first alternative of the method, the power electronic circuit carrier, and/or the metallisation applied onto the power electronic circuit carrier, and/or a base plate connected, or to be connected, to the rear face of the power electronic circuit carrier, is structured by means of local material removal with at least one laser beam, so as to reduce thermomechanical stresses occurring during the production or operation of the power electronic module (compared to a design without this structuring). This alternative of the method thus increases the service life of the power electronic module by reducing the thermomechanical stresses. In a second alternative of the method, which can also be carried out in combination with the first alternative of the method, the metallisation applied onto the front face of the power electronic circuit carrier is structured by means of local material removal with at least one laser beam, or a structure already created in the metallisation is refined or supplemented by means of local material removal with the laser beam, so as to achieve a prescribed, possibly additional, electrical functionality of the metallisation.

In both alternatives of the method, one, or a plurality of, laser beams are thus used to create the respective structures in the circuit carrier, or substrate, of the metallisation, or the base plate. This laser-assisted subtractive processing can be carried out, for example, using ultra-short pulse laser systems. Here it has been recognised that by a refinement, or a more precise design, of the structures previously created using etching methods, on the one hand, the service life of the power electronic modules can be further extended, and on the other hand, the electrical functionality can also be improved. The etching methods that have previously been used do not allow such fine structuring. This is only achieved with the proposed processing with one, or a plurality of, laser beams. Laser processing allows the finest structures to be created with very high precision.

In the first alternative method, this possibility of fine structuring is used to structure the circuit carrier, that is to say, for example, the ceramic substrate, and/or the metallisation applied onto the ceramic substrate, such that thermomechanical stresses occurring during the production or operation of the power electronic module are reduced. This applies in the same manner to the creation of structures in a base plate that may be present. The structuring can be carried out either uniformly or non-uniformly over the surface in question, with any geometries, for example in the form of holes or trenches. The structures that are suitable for reducing the thermomechanical stresses for the power electronic module in question can be determined in advance by means of a simulation. The structuring is preferably carried out by the creation of depressions, of which one, or a plurality, have a width of less than 50 µm. The said fine structuring can be created, for example, over larger regions of the metallisation, that is to say, the front-face and/or rear-face metallisation of the power electronic circuit carrier, without thereby impairing the electrical functionality of the power electronic module.

In the proposed method, the structuring can be carried out such that it extends, at least in part, into regions, which, after completion of the power electronic module, are located below one, or a plurality of, the semiconductor components of the power electronic module. This possibility of the utilisation of larger surfaces of the metallisation allows thermomechanical stresses to be better reduced than when structures are created only at the edges of the circuit carrier. By a structuring under the semiconductor component, the connection of this component to the circuit carrier is also improved; this is usually carried out with the aid of a connecting layer.

In a further form of embodiment, the structuring can also be carried out circumferentially, or partially circumferentially, around regions in the metallisation to which individual semiconductor components are applied, in the further course of the manufacturing process (component target sites). In this way, for example, solder-stop trenches can be created, as can barriers against an unwanted blurring of components during the connection process, or an unwanted distribution of connection material. Furthermore, it is also possible to use the laser beam to create suitable fine structures at the edges of the metallisations, which structures reduce the risk of detachment of the metallisation at the edges.

In the second alternative method, the laser beam/s is/are used either to create a structuring of the metallisation for purposes of forming conductor tracks, or also electrical components, or for purposes of refining or supplementing structuring that is already present, for example as a result of a previous etching method. This takes advantage of the fact that very precise structures can be created by means of material removal with a laser beam, which improve, or even supplement, the electrical functionality of the metallisation by virtue of the higher precision. Here the structuring can be achieved by means of local material removal over the entire thickness of the metallisation layer (local removal of the metallisation), or also by means of only local thinning of the metallisation layer. For example, shielding for the conductor track can be created by appropriate longitudinal structuring of an already-existing conductor track. A local increase in the resistance by tapering of a conductor track, or by local thinning of the metal layer of the conductor track, is also thereby possible with high precision. Finally, it is also possible to create a planar coil, or even a capacitor, in the metallisation by means of local material removal with the laser beam. In principle, the entire structuring of the metallisation can be created purely by means of laser processing. However, structuring already created by another method, in particular etching, can also be supplemented, or appropriately refined, by additional laser processing.

Accordingly, a power electronic module that can be produced with the proposed method has one, or a plurality of, semiconductor components on a front face of a power electronic circuit carrier, for example a ceramic substrate, which supports a metallisation applied onto the front face, or onto the front and rear faces. In one form of embodiment of the module, the power electronic circuit carrier, and/or the metallisation applied onto the power electronic circuit carrier, and/or a base plate optionally connected to the rear face of the power electronic circuit carrier, has a structure created by means of local material removal with a laser beam, by means of which thermomechanical stresses occurring during the production or operation of the power electronic module are reduced. This structure is characterised by one, or a plurality of, depressions, one or a plurality, of which preferably have a width of less than 50 μm.

In an alternative form of embodiment of the power electronic module, the metallisation applied onto the front of the power electronic circuit carrier is structured, or partially structured, by means of local material removal with a laser beam, so as to achieve a prescribed electrical functionality of the metallisation. Both forms of embodiment can also be combined with each other.

The proposed method can be used in the production of power electronic modules, so as to increase their electrical functionality, and/or service life. Examples for such power electronic modules are converters, inverters, transformers, switched-mode power supplies, or amplifiers. The method can be used independently of the particular application of the power electronic module.

BRIEF DESCRIPTION OF THE DRAWINGS

In what follows the proposed method and associated power electronic modules are again explained in more detail, using examples of embodiment in conjunction with the figures. Here.

PATHS TO THE EMBODIMENT OF THE INVENTION

Figure 1:
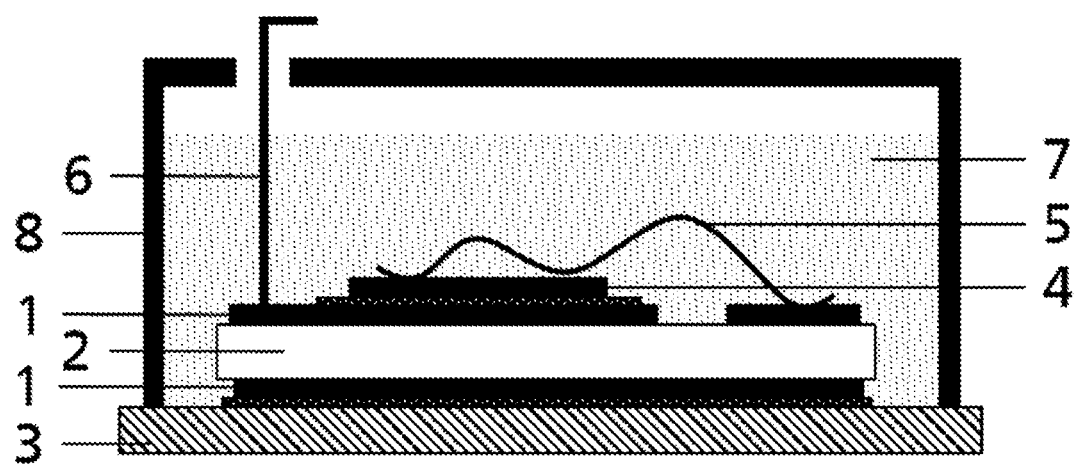
FIG. 1 shows a schematic structure of an exemplary power electronic module of the prior art.

The proposed method deals with measures to extend the service life, and/or to improve the functionality of power electronic modules. To this end, FIG. 1 shows in a schematic representation an example of the structure of a power electronic module of known art, which in this example has only one semiconductor component 4, in the form of a semiconductor chip. The semiconductor component 4 is connected to the front-face metallisation 1 of the power electronic circuit carrier via a connecting layer, which can be discerned in the figure. The power electronic circuit carrier is a ceramic substrate 2 with metallisation 1 on both faces, and on its rear, or lower, face is connected to a base plate 3 by way of a connecting layer that can be discerned in the figure. The front-face metallisation 1, on which the semiconductor component 4 is located, is suitably structured so as to enable the desired electrical connection of the semiconductor component 4 by way of the bonding wire 5 and the external connection tag 6. The entire circuit carrier, with the semiconductor component 4, is encapsulated in a dielectric encapsulation material 7, and is enclosed in a housing 8, as can be seen in FIG. 1. In the course of production of such a power electronic module, thermomechanical stresses occur during the processes of connecting the semiconductor component 4 to the circuit carrier, or the circuit carrier to the base plate 3; these lead to a bending of the circuit carrier, for example when soldering on the semiconductor component, or a bending of the entire power electronic module, for example when soldering the circuit carrier, populated with semiconductor components, onto the base plate.

The said thermomechanical stresses can be reduced by structuring of the ceramic substrate 2, of the front-face and/or rear-face metallisation 1, or also of the base plate 3. In the example shown schematically in FIG. 2, this reduction of the thermomechanical stresses is achieved by fine structuring of the rear-face metallisation 1 of the ceramic substrate 2 by means of a laser beam. To this end, in this example fine trenches with a trench width of <50 μm, and a small separation distance, are introduced with a laser beam in the rear-face metallisation over almost the entire surface of the rear-face metallisation. The resulting structured metallisation 9 can be discerned in the cross-sectional view of the circuit carrier in FIG. 2. The form of this laser structuring, either uniformly or non-uniformly, length-wise, cross-wise, depth-wise, etc., which is best suited for the power module in question, can be determined in advance from simulation calculations.

Figure 3:
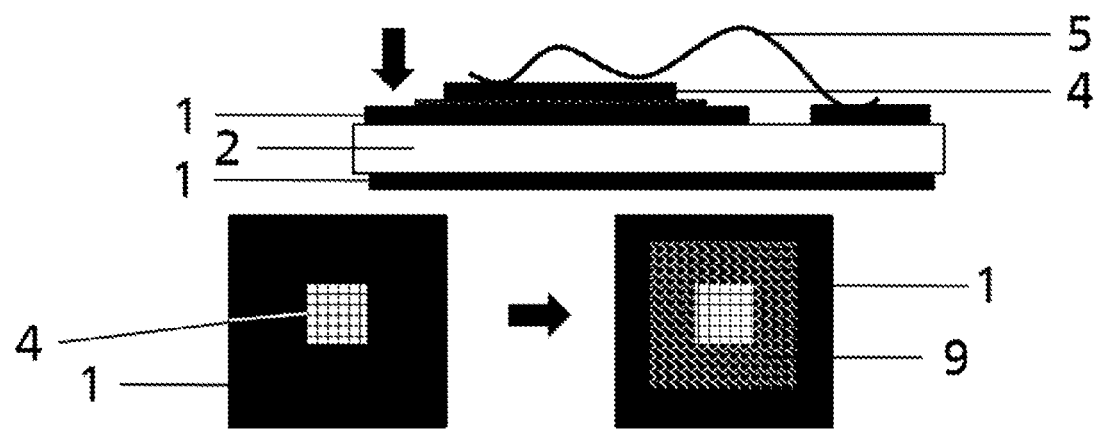
FIG. 3 shows another example of fine structuring of the circuit carrier of a power electronic module in accordance with the proposed method.

FIG. 3 shows another example of fine structuring of the metallisation 1 of the circuit carrier by means of a laser beam. In this example, the front-face metallisation 1 is finely structured by means of the laser beam. The upper part of Figure shows a cross-section through the circuit carrier with a semiconductor component 4 and a bonding wire 5 attached to the latter (cf. also FIG. 1). The lower part of FIG. 3 shows in plan view, on the left-hand side, the semiconductor component 4 on the front-face metallisation 1 without structuring, and on the right-hand side, the conditions when the fine structuring 9 is introduced into this front-face metallisation in accordance with the present method. The structuring 9 is created before the semiconductor component 4 is applied in the metallisation 1, and in this example also extends below the semiconductor component 4.

Figure 2:
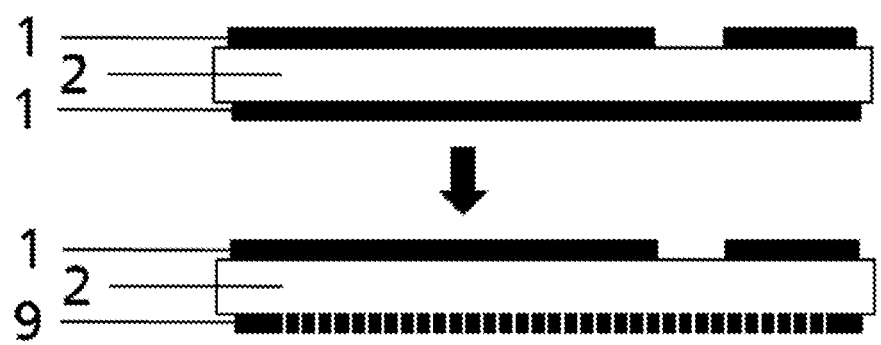
FIG. 2 shows an example of fine structuring of the circuit carrier of a power electronic module in accordance with the proposed method.

The said structuring 9, as shown in an exemplary manner in FIGS. 2 and 3, leads to an increase in the service life of the power electronic module, since thermomechanical stresses, such as occur during the production of the power module, and also during subsequent operation when there are changes in loading or ambient conditions, are reduced. This results in less wear of the power electronic module. The structure created by the laser beam does not have to penetrate the entire thickness of the metallisation (as in FIG. 2), but can also extend only over a smaller region of the thickness of this metallisation.

Figure 4:
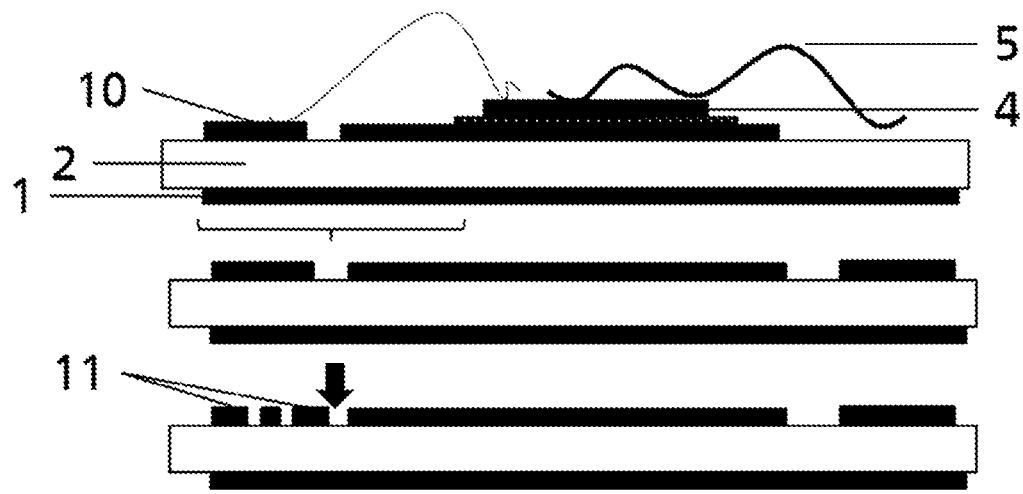
FIG. 4 shows an example of additional structuring of the already-structured front-face metallisation in accordance with the proposed method.

Finally, FIG. 4 shows another example of the implementation of the proposed method, in this case so as to increase the electrical functionality of the power electronic module. In power electronic modules, parasitic coupling of electrical conductor tracks on the ceramic substrate can occur as a result of structuring of the front-face metallisation. Such parasitic coupling is undesirable, for example, when the semiconductor component 4 takes the form of the gate line 10 of a semiconductor transistor. To this end, FIG. 4 shows in cross-section in the upper part firstly a corresponding circuit carrier with front- and rear-face metallisation 1, in which the front-face metallisation on the ceramic substrate 2 has already been structured accordingly so as to form the gate line 10. With the proposed method, this structure, created for example by etching, can be further refined so as to enable a shielding of the gate line 10. For this purpose, the existing conductor track forming the gate line 10 is structured by means of laser-assisted material removal such that two conductor tracks 11 run along both sides of what is then the narrower gate line 10, which tracks serve to shield the gate line 10 by connection to a suitable electrical potential. This is shown in the lower part of FIG. 4.

In addition it is also possible, by partial removal (thinning) of the gate line 10 running in the middle, to create a structure in which a metallic cover can be attached (e.g. soldered or bonded) above the gate line 10, which cover rests on the two conductor tracks 11. The possibility of creating such shielded lines, and thus an additional functionality of the power electronic module, is only made possible by the use of laser-assisted material removal, since only by means of this processing with a laser beam can the required fine structuring, and a sufficiently high precision, be achieved.

REFERENCE LIST

1 Metallisation, or conductor track
2 Ceramic substrate
3 Base plate
4 Semiconductor component
5 Bonding wire
6 External connection tag
7 Dielectric encapsulation material
8 Housing
9 Structuring, or structured metallisation
10 Gate line
11 Conductor tracks for shielding purposes

The invention claimed is:

1. A method for increasing the electrical functionality, and/or service life, of power electronic modules, which have one, or a plurality of, semiconductor components (4) on a front face of a power electronic circuit carrier (2), which supports a metallization (1) applied onto the front face, or onto the front and rear faces, in which method, in the course of the production of the power electronic modules:

the power electronic circuit carrier (2), and/or the metallization (1) applied onto the power electronic circuit carrier (2), and/or a base plate (3) connected, or to he connected, to a rear face of the power electronic circuit carrier (2), or the metallization (1) applied thereto, is structured by means of local material removal with at least one laser beam, so as to reduce thermomechanical stresses occurring during the production or operation of the power electronic module, and/or the metallization (1) applied onto the front face of the power electronic circuit carrier (2) is structured, or a structure (10) already created in the metallization (1) applied onto the front face of the power electronic circuit carrier (2) is refined or supplemented, by means of local material removal with at least one laser beam, so as to achieve a prescribed electrical functionality of the metallization (1).

2. The method according to claim 1,
characterized in that
the structuring is carried out by the creation of depressions, of which one or a plurality have a width of <50 μm.

3. The method according to claim 1,
characterized in that
the structuring, in the case of metallization (1) applied onto the front and rear faces, is carried out, at least in part, in the metallization (1) applied onto the rear face.

4. The method according to claim 1,
characterized in that
the structuring is carried out, at least in part, in the metallization (1) applied onto the front face, and extends into regions, which are located below one, or a plurality of, the one, or a plurality of, semiconductor components (4), after completion of the power electronic module.

5. The method according to claim 1, characterized in that
the structuring is carried out, at least in part, in the metallization (1) applied onto the front face, such that in each case it encloses, at least in part, individual regions, above which is located in each case one of the one, or a plurality of, semiconductor components (4), after completion of the power electronic module.

6. The method according to claim 1, characterized in that
the structuring is carried out, at least in part, at the edge of the metallization (1).

7. The method according to claim 1, characterized in that
electrical components, in particular in the form of one, or a plurality of, planar coils and/or one, or a plurality of, capacitors, are formed in the metallization (1) applied onto the front face of the power electronic circuit carrier, by means of said. local material removal.

8. The method according to claim 1,
characterized in that
one, or a plurality of, conductor tracks created in the metallization (1) applied onto the front face of the power electronic circuit carrier (2), are locally thinned, or tapered, by means of said local material removal, so as to increase their electrical resistance.

9. The method according to claim 1,
characterized in that
one, or a plurality of, conductor tracks created in the metallization (1) applied onto the front face of the power electronic circuit carder (2), are separated into three tracks running next to each other, by means of said local material removal, so as to enable electrical shielding.

* * * * *